(12) United States Patent
Vogelsang et al.

(10) Patent No.: US 12,431,182 B2
(45) Date of Patent: Sep. 30, 2025

(54) ROW HAMMER MITIGATION

(71) Applicant: Rambus Inc., San Jose, CA (US)

(72) Inventors: Thomas Vogelsang, Mountain View, CA (US); Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 211 days.

(21) Appl. No.: 18/206,241

(22) Filed: Jun. 6, 2023

(65) Prior Publication Data

US 2023/0395118 A1    Dec. 7, 2023

Related U.S. Application Data

(60) Provisional application No. 63/349,739, filed on Jun. 7, 2022.

(51) Int. Cl.
*G11C 11/406* (2006.01)
*G11C 11/4078* (2006.01)

(52) U.S. Cl.
CPC .. *G11C 11/40615* (2013.01); *G11C 11/40622* (2013.01); *G11C 11/4078* (2013.01)

(58) Field of Classification Search
CPC ........ G11C 11/40615; G11C 11/40622; G11C 11/4078
USPC ......................................................... 365/222
See application file for complete search history.

(56) References Cited

U.S. PATENT DOCUMENTS

| | | | |
|---|---|---|---|
| 6,310,814 B1 * | 10/2001 | Hampel | G11C 11/406 365/230.03 |
| 10,061,541 B1 * | 8/2018 | Lee | G11C 11/40611 |
| 10,770,127 B2 | 9/2020 | Shore et al. | |
| 10,825,534 B2 | 11/2020 | Nale | |
| 11,094,699 B1 | 8/2021 | Brewer et al. | |
| 2019/0198090 A1 * | 6/2019 | Lee | G11C 29/70 |
| 2021/0257366 A1 | 8/2021 | Lee | |
| 2022/0005809 A1 | 1/2022 | Kim et al. | |

FOREIGN PATENT DOCUMENTS

WO    WO-2015047304 A1 *    4/2015    ........... G06F 12/123

* cited by examiner

*Primary Examiner* — Ly D Pham
(74) *Attorney, Agent, or Firm* — The Neudeck Law Firm, LLC

(57) ABSTRACT

A 3D DRAM architecture may have one or more layers of cells where the access transistors of the memory cell array are fabricated among the metal layers rather than in the semiconductor (e.g., silicon) substrate. Counter and counter control circuits for each row in the memory cell array are fabricated under the array. These counters track the number of row hammers each row experiences. When a counter indicates a row has experienced a threshold number of row hammers, that row is refreshed. The row may be refreshed immediately after the current row is closed. The row may be scheduled to be refreshed as part of a regular refresh sequence. A signal may be sent to the memory controlling indicating that the bank with the row being refreshed immediately should not be accessed until the refresh is complete.

20 Claims, 10 Drawing Sheets

ACTIVATE A FIRST ROW OF A MEMORY ARRAY
702

BASED ON ACTIVATING THE FIRST ROW, ADVANCE A FIRST COUNTER VALUE STORED IN A FIRST REGISTER, THE FIRST REGISTER CORRESPONDING TO A SECOND ROW THAT IS ADJACENT TO THE FIRST ROW, THE FIRST REGISTER DISPOSED ON A SUBSTRATE THAT DOES NOT CONTAIN THE MEMORY ARRAY
704

*FIG. 7*

ROW HAMMER MITIGATION

BRIEF DESCRIPTION OF THE DRAWINGS

FIG. 7 is a flowchart illustrating an example method of tracking rows being hammered.

DETAILED DESCRIPTION OF THE EMBODIMENTS

Repeated row activations of the same row in a memory device (e.g., dynamic random access memory—DRAM), whether malicious or accidental, may cause cells in the neighborhood of the repeatedly activated row to lose a stored value. This effect on storage reliability has been termed "row hammer." In an embodiment, a 3D DRAM architecture may have one or more layers of cells where the access transistors of the memory cell array are fabricated among the metal layers rather than in the semiconductor (e.g., silicon) substrate. Counter and counter control circuits for each row in the memory cell array are fabricated under the array. These counters track the number of row hammers each row experiences. In an embodiment, when a counter indicates a row has experienced a threshold number of row hammers, that row is refreshed. In an embodiment, the row may be refreshed immediately after the current row is closed. In an embodiment, the row is scheduled to be refreshed as part of a regular refresh sequence. If the row is refreshed immediately, a signal may be sent to the memory controlling indicating that the bank with the row should not be accessed until the refresh is complete.

Figure 1:
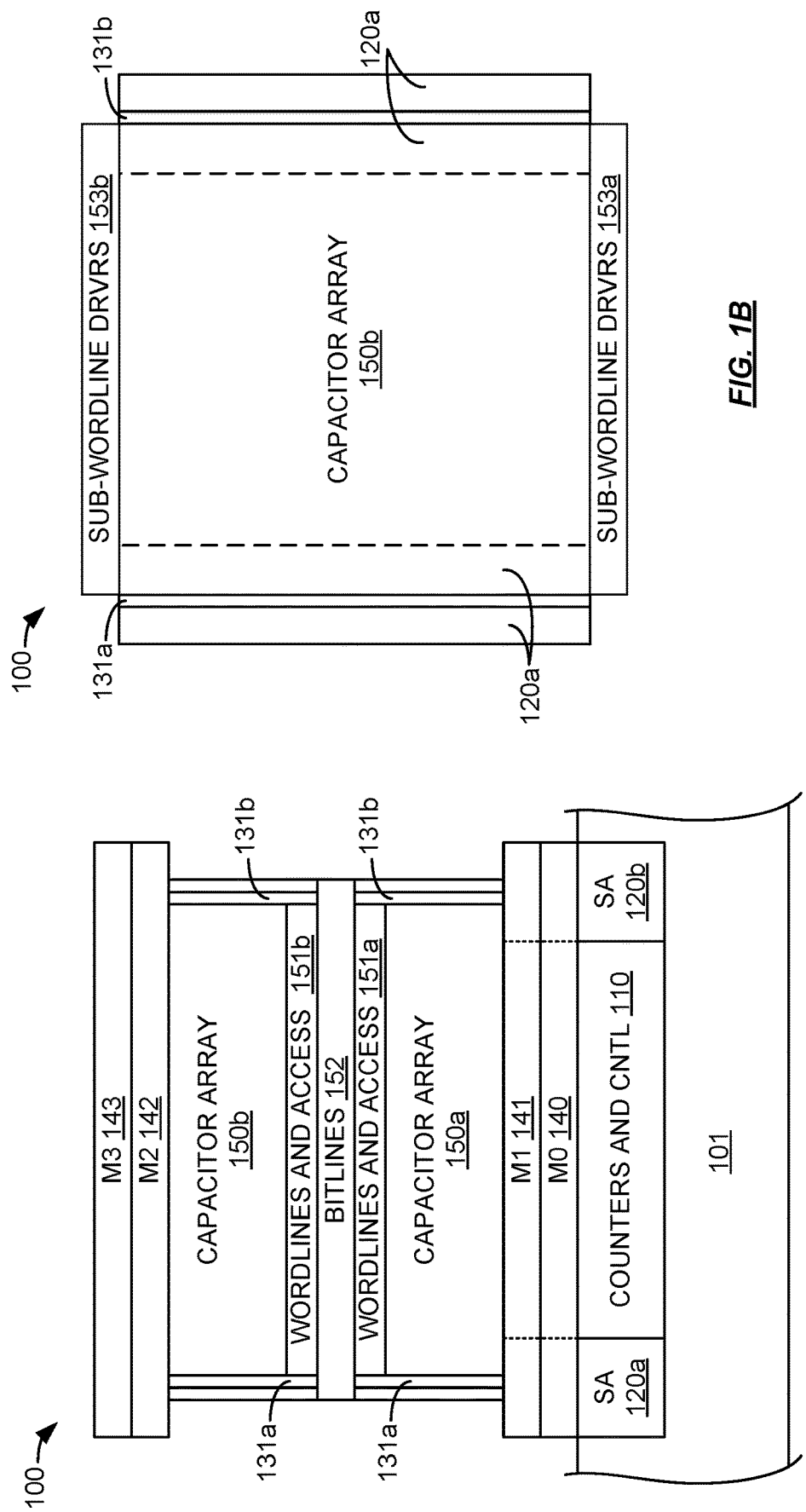
FIG. 1A is a cross-section illustration of an example memory array tile (MAT) of a three-dimensional (3D) dynamic random access memory (DRAM).
FIG. 1B is an example floorplan of selected layers of the example MAT of the 3D DRAM.

FIG. 1A is a cross-section illustration of an example three-dimensional (3D) dynamic random access memory (DRAM). FIG. 1B is an example floorplan of selected layers of the example MAT of the 3D DRAM. In FIGS. 1A-1B, memory array tile 100 is disposed on substrate 101 (e.g., silicon) and comprises transistors for counters and control circuitry 110, transistors for sense amplifier circuitry 120a-120b, lowest level interconnect (M0) layer 140 (e.g., polysilicon or metal), second lowest level interconnect (M1) layer 141 (e.g., metal), third lowest level interconnect (M2) layer 142, top level interconnect (M3) layer 143, vias 131a-131b, capacitor arrays 150a-150b, wordlines and access transistors layer 151a-151b, bitline layer 152, and sub-wordline drivers 153a-153b.

In FIG. 1A, the transistors for counters and control circuitry 110 and the transistors for sense amplifier circuitry 120a-120b are illustrated as fabricated in substrate 101. The next layer above the transistors for counters and control circuitry 110 and the transistors for sense amplifier circuitry 120a-120b is the M0 interconnect layer 140. Above the M0 interconnect layer is the M1 interconnect layer 141. Above the M1 interconnect layer is capacitor array 150a. Above capacitor array 150a is wordline and access transistor layer 151a. Above the wordline and access transistor layer 151a is the bitline layer 152. Above bitline layer 152 is wordline and access transistor layer 151b. Above wordline and access transistor layer 151b is capacitor array 150b. Above capacitor array 150b is the M2 interconnect layer 142. Above the M2 interconnect layer is the M3 interconnect layer 143. Vias 131a-131b run vertically to interconnect the circuitry of wordlines and access transistor layers 151a-151b and/or bitline layer 152 to one or more of M1 layer 141 and/or M2 layer 142.

Counters and control circuitry 110 comprises the transistors for counters and control circuitry 110 that are fabricated in substrate 101, at least a portion of the M0 layer 140 above the transistors for counters and control circuitry 110, and may also include at least a portion of the M1 layer 141 above the transistors for counters and control circuitry 110. Thus, it should be understood that counters and control circuitry 110 includes interconnect or other elements (e.g., polysilicon gates) formed in the M0 layer 140. Thus, the M0 layer 140 and optionally the M1 layer 141 may be used to interconnect the transistors for counters and control circuitry 110 thereby forming the active circuits of counters and control circuitry 110. This is illustrated in FIG. 1A by the dotted lines running from the left and right edges of counters and control circuitry 110 through the M0 layer 140 and the M1 layer 141. Accordingly, counters and control circuitry 110 should be considered to include those interconnects in the M0 layer 140 and the M1 layer that create the circuits (e.g., logic gates, inputs, outputs, power supplies, etc.) of counters and control circuitry 110.

Similarly, sense amplifier circuitry 120a-120b comprises the transistors for sense amplifier circuitry 120a-120b that are fabricated in substrate 101, at least a portion of the M0 layer 140 above the transistors sense amplifier circuitry 120a-120b, and may also include at least a portion of the M1 layer 141 above sense amplifier circuitry 120a-120b. Thus, it should be understood that sense amplifier circuitry 120a-120b includes interconnect or other elements (e.g., polysilicon gates) formed in the M0 layer 140. Thus, the M0 layer 140 and optionally the M1 layer 141 may be used to interconnect the transistors for sense amplifier circuitry 120a-120b thereby forming the active circuits of sense amplifier circuitry 120a-120b. This is illustrated in FIG. 1A by the dotted lines running from the left and right edges of counters and control circuitry 110 through the M0 layer 140 and the M1 layer 141. Accordingly, sense amplifier circuitry 120a-120b should be considered to include those interconnects in the M0 layer 140 and the M1 layer that create the circuits (e.g., logic gates, inputs, outputs, power supplies, etc.) of sense amplifier circuitry 120a-120b.

In an embodiment, counters and control circuitry 110 are disposed underneath at least a portion of capacitor array 150a. Counters and control circuitry 110 includes a plurality of counters each corresponding to a respective one of the plurality of wordlines fabricated in worldline and access transistor layers 151a-151b. Counters and control circuitry 110 also includes circuitry to, in response to each row activation, update at least one value in the plurality of counters in response to each row activation. For example, a first value in a first counter in counters and control circuitry 110 corresponding to a first wordline may be advanced in response to an activation of a second wordline that is a neighbor (i.e., adjacent to with no intervening wordlines) of the first wordline. In another example, other values in other counters in counters and control circuitry 110 corresponding to other wordlines may be advanced in response to an activation of the second wordline, where one or more of the other wordlines have one or more intervening wordlines between the respective other wordline and the second wordline.

Counters and control circuitry 110 may also include circuitry to, in response to each row activation, initialize a second value in a second counter corresponding to the second wordline. Counters and control circuitry 110 may also include circuitry to, based on a third value in the first counter meeting a threshold criteria, refresh a first row corresponding to the first wordline. In an embodiment, the first row may first be scheduled to be refreshed (e.g., indicate the need to refresh to refresh logic or state machine), and then as part of a refresh sequence, eventually be refreshed. In another embodiment, the first wordline may be refreshed without an intervening operation by the memory array after a second row corresponding to the second wordline is closed. In this case, the memory device that includes counters and control circuitry 110 may indicate to a controller to not use the bank with the first row until the refresh of the first row is complete.

Figure 2:
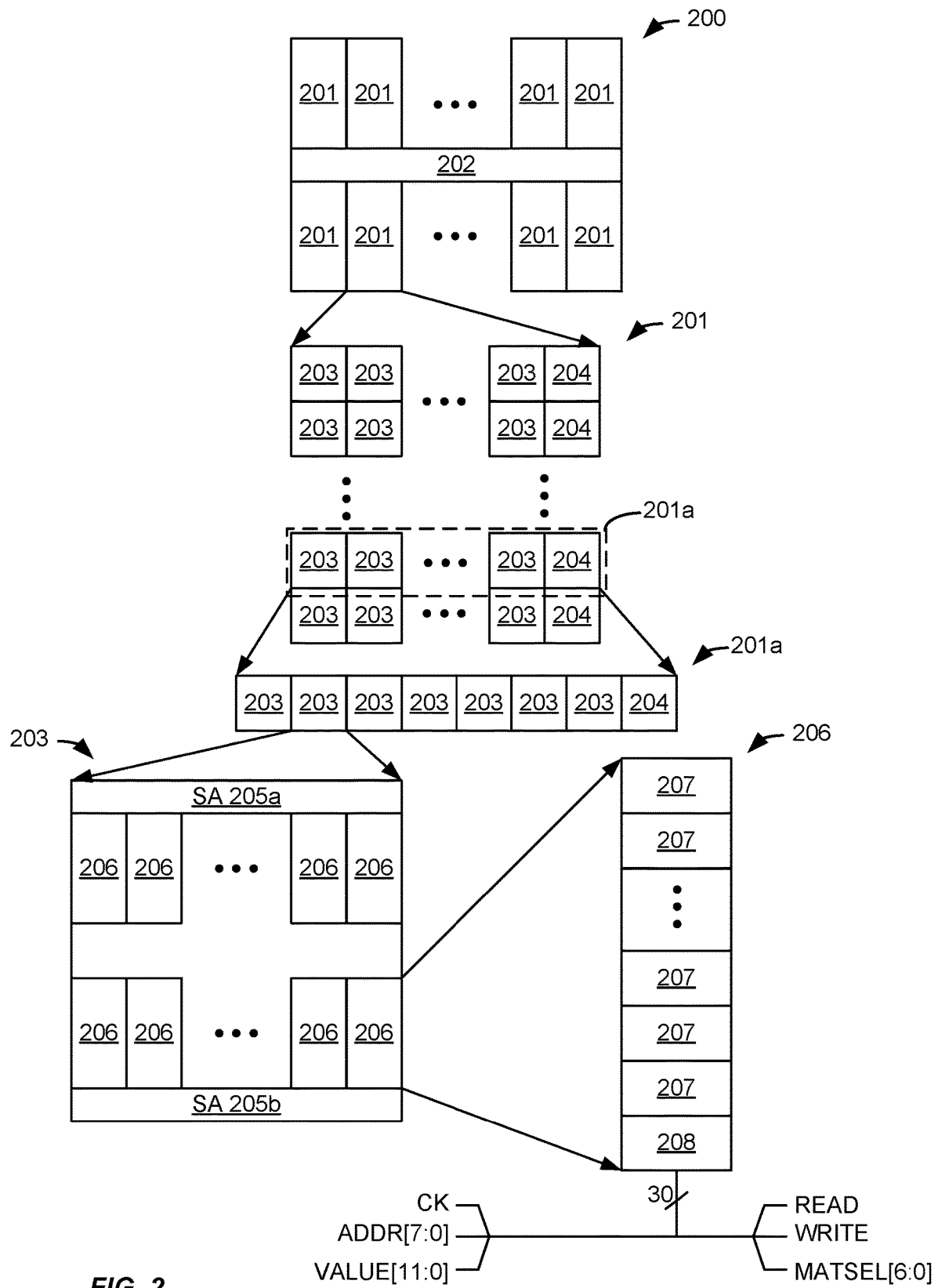
FIG. 2 is an illustration of an example 3D DRAM chip floorplan for row hammer mitigation.

FIG. 2 is an illustration of an example 3D DRAM chip floorplan for row hammer mitigation. In FIG. 2, 3D DRAM integrated circuit 200 comprises blocks 201 and input-output/periphery circuitry 202. In an example, each block 201 may have 65,536 (64 k) wordlines of 1024 Bytes (1 kB) in length for a total of 512 Mb per block. Integrated circuit 200, in this example, may have 16 blocks one side of periphery circuitry 202 and 16 blocks on the other side of periphery circuitry 202.

As illustrated in FIG. 2, each block 201 is organized as stepped and repeated MATs. In the example, in FIG. 2, the wordline direction is illustrated in the horizontal direction and the bitline direction is illustrated in the vertical direction. Thus, in the example, there are 8 columns of MATs in the horizontal direction resulting in a 1 kB page (i.e., 1024 bits per mat). Also in the example, there are 49 rows of MATs in the vertical direction resulting in $64k$ wordlines (i.e., 1300 wordlines per MAT). Each of the 49 rows (a.k.a., wordline stripe) of MATs have counter and control circuitry underneath them. In particular, in FIG. 2, the leftmost 7 MATs of each wordline stripe 201a have under MAT circuitry 203 underneath, and the rightmost MAT of each wordline stripe 201a has under MAT control/decode circuitry 204.

Under MAT circuitry 203 comprises sense amplifier circuitry 205a and two rows of counter elements 206. In the example, each block of under MAT circuitry 203 includes 1300 number of counter elements 206 (i.e., one for each wordline). Each counter element 206 includes 12 one-bit memory cells (e.g., SRAM) 207 and control/decode circuitry 208. Each counter element 206 communicates receives a clock signal (CK), receives address signals ADDR [7:0], bidirectionally communicates counter value signals VALUE[11:0], receives a READ signal, receives a WRITE signal, and receives MAT select signals MATSEL[6:0].

Figure 3:
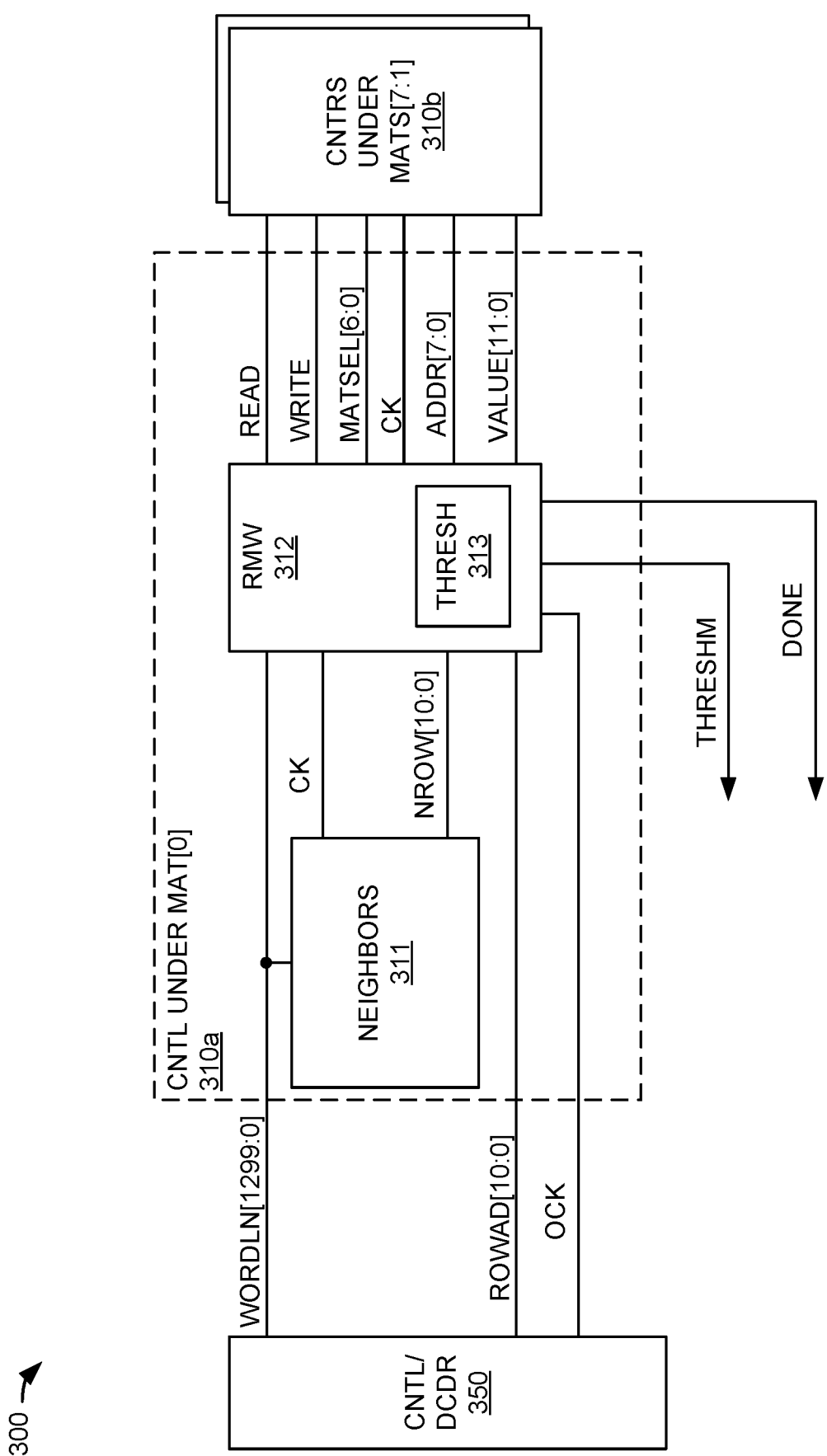
FIG. 3 is a block diagram illustrating example counter and control circuitry to mitigate row hammer.

FIG. 3 is a block diagram illustrating example counter and control circuitry to mitigate row hammer. Counter and control circuitry 300 comprises control circuitry under MAT[0] (e.g., under MAT control/decode circuitry 204) 310a, counter elements under MATs[7:1] (e.g., counter elements 206) 310b, and control/decoder circuitry 350. Control circuitry 310a comprises neighbors circuitry 311, and read-modify-write (RMW) circuitry 312. RMW circuitry 312 includes threshold circuitry 313. Neighbors circuitry 311 receives, from control/decoder circuitry 350, a one hot (e.g., one of 1300) wordline select signal that indicates the row being activated. In an embodiment, neighbors circuitry 311 receives the row address and decodes the row address to determine the neighboring row(s) being hammered. In this embodiment, the input to neighbors circuitry 311 would not be a one-hot decoded row but the external row address that goes into control/decoder circuitry 350 (not shown in FIG. 3).

Based on the indication of the row being activated, neighbors circuitry 311 outputs, to RMW circuitry 312 one or more counter element addresses (NROW[10:0]), timed by a clock signal CK, of counter elements corresponding to rows that are being hammered by the activation of the indicated row. In an embodiment, the counter element/row addresses output by neighbors circuitry 311 may include (or correspond to) those rows that are both physically adjacent to (i.e., next to without any physically intervening rows), and those rows that are not physically adjacent to, the indicated row (i.e., may have one or more rows physically between the indicated row and the row whose address is output).

RMW circuitry 312 receives the one or more addresses of the rows being hammered and retrieves the hammer count values from the respective counter elements corresponding to these rows from the counter elements under MATs[7:1] 310b. Each of these hammer count values (e.g., received via the VALUE signals as addressed by ADDR signals) from the respective counter element—e.g., counter element 206), is compared to a threshold value by threshold circuitry 313.

If a hammer count value does not meet the threshold value (e.g., is less than, greater than—depending on whether counter element values are incremented or decremented with each hammer event), then the hammer count value for that row is advanced (i.e., incremented or decremented, as configured, to count up or count down, respectively) and the advanced value is written back (e.g., via the VALUE signals) to the respective counter element.

If a hammer count value meets the threshold value, (e.g., is equal to, greater than, or less than, as appropriate), RMW circuitry 312 outputs, to control/decoder circuitry 350 and timed by a clock signal OCK (output clock), and indicator that a row has met the threshold (THRESHM) the row address of the row that has meet the threshold value. RMW circuitry 312 outputs, to control/decoder circuitry 350, the row address of the row that has meet the threshold value so that control/decoder circuitry 350 may refresh the indicated row. Control circuitry 310a repeats the process of determining whether the hammer count associated with the counter element/row addresses output by neighbors circuitry 311 meets the threshold for each address output by neighbors circuitry 311. When all of the counter element/row addresses output by neighbors circuitry 311 have been processed. RMW circuitry 312 signals (e.g., via DONE) control/decoder circuitry 350 that no more row addresses are going to be received, for refreshing, as a result of the current activation.

Figure 4:
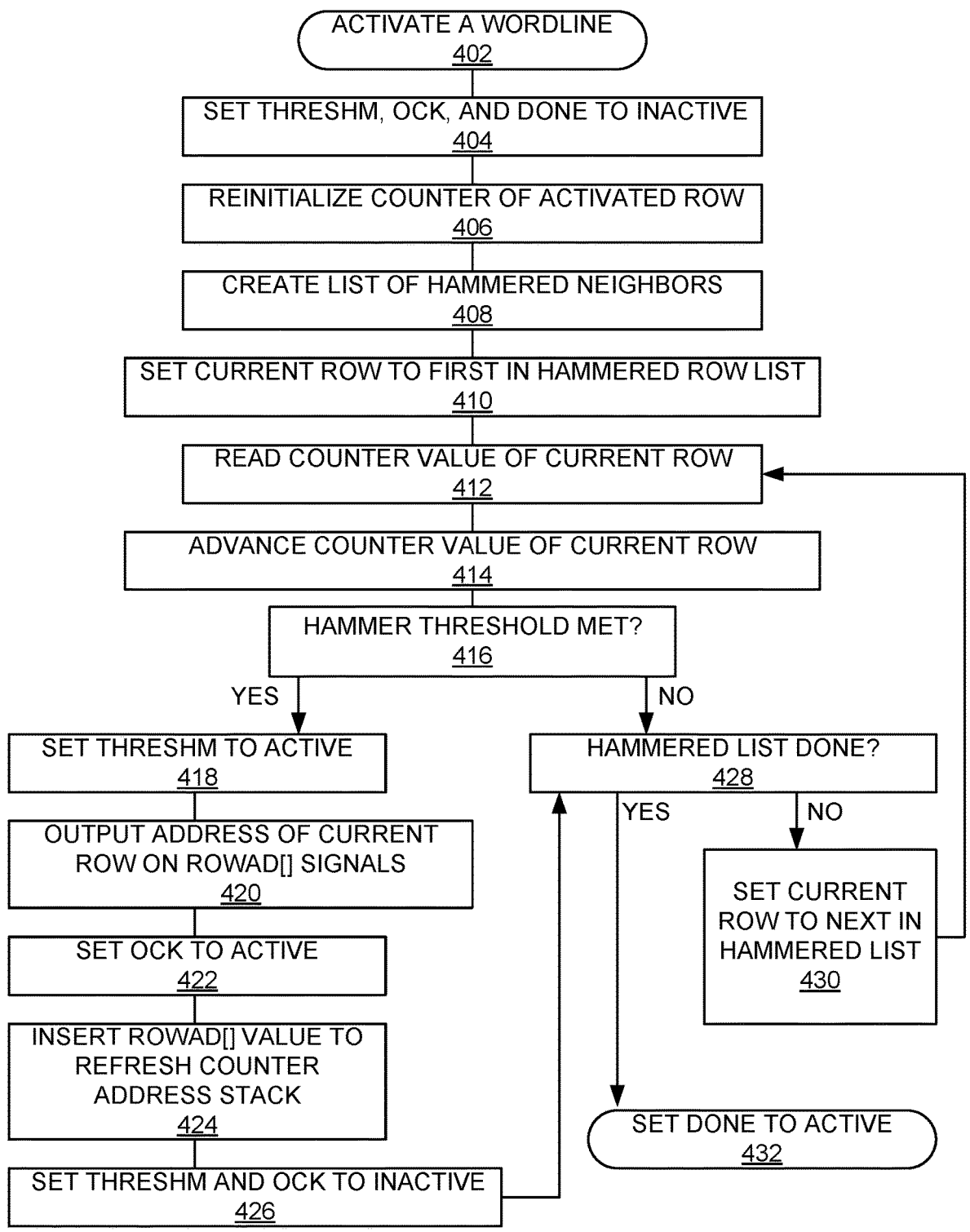
FIG. 4 is a flowchart illustrating an example method of mitigating row hammer.

FIG. 4 is a flowchart illustrating an example method of mitigating row hammer. One or more steps illustrated in FIG. 4 may be performed by, for example, MAT 100, integrated circuit 200, counter and control circuitry 300, and/or their components. A wordline is activated (402). For example, control/decoder circuitry 350 may activate one of the WORDLN[1299:0] signals to activate a wordline in one of MATs 310a-310b.

The THRESHM, OCK, and DONE signals are set to inactive (404). For example, RMW circuitry 312 may set each of the THRESHM, OCK, and DONE signals being provided to control/decoder circuitry 350 to inactive states. The counter of the activated row is reinitialized (406). For example, RMW circuitry 312 may write to the counter corresponding to the activated row an initial value (e.g., 0). A list of hammered neighbors is created (408). For example, neighbors circuitry 311, based on the activated row signal received from control/decoder circuitry 350, may generate a list of addresses of rows adjacent to, or in the vicinity of, the activated row (a.k.a., hammered row list).

The current row is set to the first row in the hammered row list (410). For example, neighbors circuitry 311 may transmit, to RMW circuitry 312, the row address of the first row in hammered row list. In another example, neighbors circuitry 311 may transmit, to RMW circuitry 312, the entire hammered row list and RMW circuitry 312 may select a first row from the received hammered row list.

The counter value of the current row is read (412). For example, RMW circuitry 312 may read, from one of MATs [7:1], the value of the counter associated with the currently selected row. The counter value of the current row is advanced (414). For example, RMW circuitry 312 may increment the received value and write the incremented value back to the counter associated with the currently selected row.

It is determined whether the hammer threshold is met (416). If the hammer threshold is met, flow proceeds to box 418. If the hammer threshold is not met, flow proceeds to box 428. For example, threshold circuitry 313 of RMW circuitry 312 may compare the incremented value associated with the currently selected row to a threshold. If the hammer threshold is not met, it is determined whether all the row addresses in the hammered list have been processed (428). If all of the row addresses in the hammered list have been processed, flow proceeds to box 432. In box 432, the DONE signal is set to active and the flow ends (432). If not all of the row addresses in the hammered list have been processed, the current row is set to the next row in the hammered list (430). After a new row has been selected as the current row, flow proceeds back to box 412.

If, back in box 416, the hammer threshold was met, the THRESHM signal is set to an active state (418). For example, if the incremented value associated with the currently selected row meets the threshold, threshold circuitry 313 of RMW circuitry 312 may indicate that the current row meets the threshold by activating the THRESHM signal. The address of the current row is output on ROWAD[ ] signals (420). For example, RMW circuitry 312 may indicate, using the ROWAD[ ] signals and to control/decoder circuitry 350, the address of a row that has met the hammered row count threshold. The OCK signal is set to active (422). For example, RMW circuitry 312 may indicate, using the OCK signal and to control/decoder circuitry 350, that the address of a row that has met the hammered row count threshold is present on the ROWAD[ ] signals.

The value on the ROWAD[ ] signals is inserted into the refresh counter stack (424). For example, control/decode circuitry 350 may insert the row address present on the ROWAD[ ] signals into a list of rows to be refreshed (e.g., a queue). THRESHM and OCK signals are set to inactive (426). For example, RMW circuitry 312 may indicate, using the OCK signal and/or the THRESM signal and to control/decoder circuitry 350, that the value on ROWAD[ ] is no longer valid by inactivating the OCK signal and/or the THRESM signal. Flow then proceeds to box 428.

Figure 5:
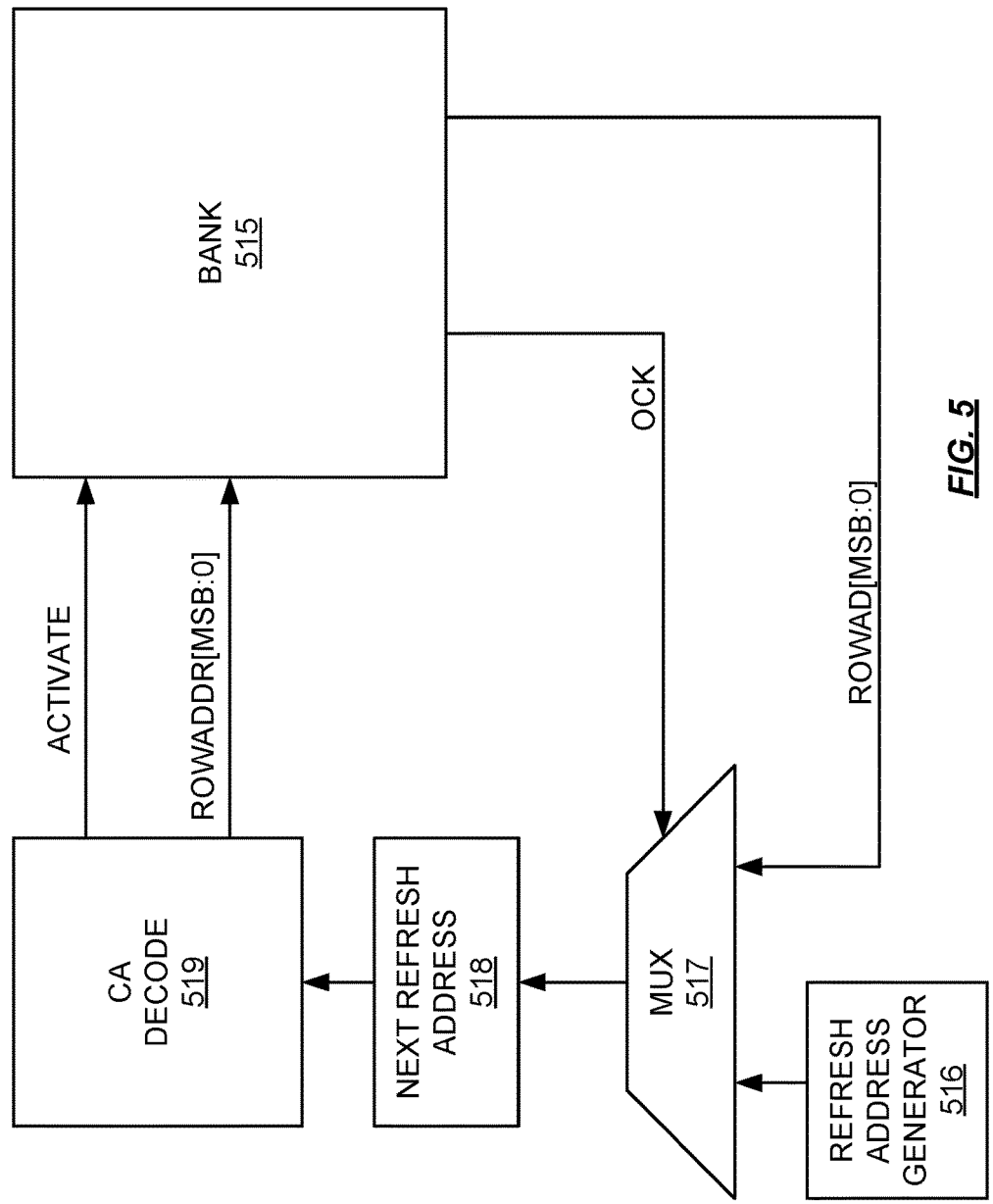
FIG. 5 is a block diagram illustrating example circuitry to refresh rows of a bank.

FIG. 5 is a block diagram illustrating example circuitry to refresh rows of a bank. In FIG. 5, system 500 comprises memory bank 515, refresh address generator 516, address multiplexor (MUX) 517, next refresh address register 518, and CA decoder circuitry 519. Bank 515 is operatively coupled to refresh address MUX 517 via OCK signal and ROWAD[ ] signals. The ROWAD[ ] signals (e.g., from MAT[0] 310a) are provided to a first input of address MUX 517. The OCK signal (e.g., from MAT[0] 310a) is operatively coupled to the control input of address MUX 517. Refresh address generator 516 is operatively coupled to a second input of address MUX 517. The output of address MUX 517 is provided to next refresh address register 518. Thus, the state of the OCK signal received from bank 515 determines which of refresh address generator 516 and bank 515 (e.g., RMW circuitry 312) is providing the next address to next refresh address register 518.

The value in next refresh address register 518 is provided to CA decoder circuitry 519. CA decoder circuitry 519, determines when the row associated with the value in the next refresh address register 518 is to be refreshed. When the row associated with the value in the next refresh address register 518 is to be refreshed, CA decode circuitry 519 provides, using the signals ROWADDR[ ], the value in the next refresh address register 518 to bank 515 along with an indicator (ACTIVATE) that the row associated with the value on the ROWADDR[ ] signals is to be activated—thereby refreshing the row.

Figure 6:
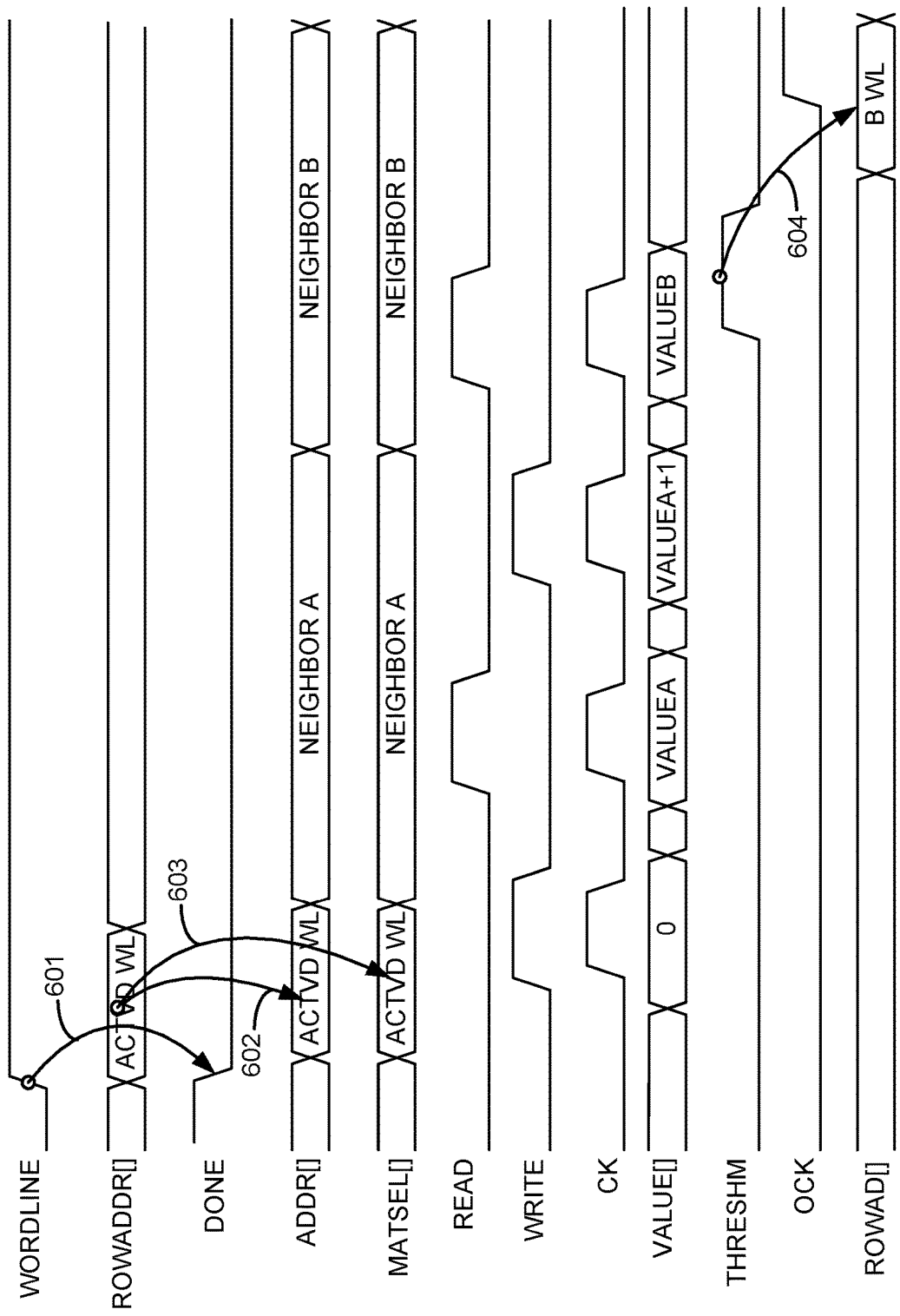
FIG. 6 is a timing diagram illustrating example signals to update row hammer counters and refresh a hammered row that meets the row hammer threshold count.

FIG. 6 is a timing diagram illustrating example signals to update row hammer counters and refresh a hammered row that meets the row hammer threshold count. In FIG. 6, time is increasing from left to right. At the initial time illustrated in FIG. 6, a wordline signal (WORDLINE—e.g., one of WORDLN[1299:0] of FIG. 3) is inactive indicating the associated wordline is not (yet) activated; the DONE signal (e.g., the DONE signal of FIG. 3) is active indicating the control circuitry under MAT[0] 310a is not busy; the READ signal (e.g., the READ signal of FIG. 3) is inactive indicating the control circuitry under MAT[0] 310a is not signaling a counter element to perform a read operation; the WRITE signal (e.g., the WRITE signal of FIG. 3) is inactive indicating the control circuitry under MAT[0] 310a is not signaling a counter element to perform a write operation; the THRESM signal (e.g., the THRESM signal of FIG. 3) is inactive indicating the current value on ROWADDR[ ] is not associated with a row that has met the hammered row threshold count; and the OCK signal (e.g., the OCK signal of FIG. 3) is inactive indicating the value on ROWADD[ ] is not to be used as a refresh address. Later in time, WORDLINE is set to the active state and the row address of the activated wordline is provided on the ROWADDR[ ] signals (e.g., Based on WORDLINE being set to the active state, the DONE signal is set to the inactive state. This is illustrated in FIG. 6 by arrow 601 running from the transition of the WORDLINE signal to the transition of the DONE signal.

The least significant bits of the row address of the activated wordline (e.g., ROWADDR[10:0]) are partially decoded to determine which counter element should be read and the address of that counter element is propagated to the counter element select signals (e.g., ADDR[7:0] of FIG. 3). This is illustrated in FIG. 6 by arrow 602 running from the "activated wordline value" on ROWADDR[ ] to the "activated wordline value" on ADDR[ ]. The most significant bits of the row address of the activated wordline (e.g., ROW-ADDR[MSB:11]) are decoded into a "one hot" group of select signals (i.e., only one signal is active of all the signals) that are propagated on the MAT select signals (e.g., MAT-SEL[6:0] of FIG. 3). This is illustrated in FIG. 6 by arrow 603.

With the corresponding MAT[ ] and counter element within that MAT selected corresponding to the activated wordline, the WRITE and CK signals are both activated at the same time while an initial value (e.g., 0) is provided on the VALUE[ ] signals. This causes the initial value to be written to the counter register corresponding to the activated wordline. This is illustrated in FIG. 6 by the VALUE[ ] signals showing a "0" while CK and WRITE are both active. After the initial value is written to the counter corresponding to the activated wordline, WRITE and CK are deactivated.

The address information to select a counter element corresponding to a first neighbor row, "NEIGHBOR A" (e.g., as indicated by neighbors circuitry 311 of FIG. 3) is placed on the ADDER[ ] and MATSEL[ ] signals. While the address information to select a counter element corresponding to a first neighbor row is on the ADDER[ ] and MATSEL[ ] signals. READ and CK are activated. This causes the counter element corresponding to NEIGHBOR A to place the value in its counter register on the VALUE[ ] signals. While the NEIGHBOR A count value is on the VALUE[ ] signals, THRESHM remains inactive indicating that the NEIGHBOR A count value has not met the row hammer threshold count.

The NEIGHBOR A count value is incremented and placed on the VALUE[ ] signals (e.g., by RMW circuitry 312 in FIG. 3). While the incremented NEIGHBOR A count value is on the VALUE[ ] signals, the WRITE and CK signals are both activated at the same time to cause the incremented count value to be written to the counter element corresponding to NEIGHBOR A.

After the incremented count value to be written to the counter element corresponding to NEIGHBOR A, the address information to select a counter element corresponding to a second neighbor row, "NEIGHBOR B" is placed on the ADDER[ ] and MATSEL[ ] signals. While the address information to select a counter element corresponding to the second neighbor row is on the ADDER[ ] and MATSEL[ ] signals. READ and CK are activated. This causes the counter element corresponding to NEIGHBOR B to place the value in its counter register on the VALUE[ ] signals. While the NEIGHBOR B count value is on the VALUE[ ] signals, THRESHM transitions to active indicating that the NEIGHBOR B count value has met the row hammer threshold count. As a result of THRESM transitioning to active, the address of the NEIGHBOR B wordline is placed on ROWAD[ ] (e.g., ROWAD[ ] signals of FIG. 3 and/or FIG. 5) and OCK is activated to indicate the row address present on the ROWAD[ ] signals should be refreshed. This is illustrated in FIG. 6 by arrow 604.

FIG. 7 is a flowchart illustrating an example method of tracking rows being hammered. One or more steps illustrated in FIG. 7 may be performed by, for example, MAT 100, integrated circuit 200, counter and control circuitry 300, system 500, and/or their components. A first row of a memory array is activated (702). For example, a first row of MAT 100 may be activated (e.g., by control/decode circuitry 350).

Based on activating the first row, a first counter value stored in a first register is advanced where the first register corresponds to a second row that is adjacent to the first row and the first register is disposed on a substrate that does not contain the memory array (704). For example, counters and control circuitry 110 may advance a counter value in a counter element (e.g., counter element 206) that is associated with a second row that is adjacent to the first row and is part of counters and control circuitry 110 that are fabricated on substrate 101.

Figure 8:
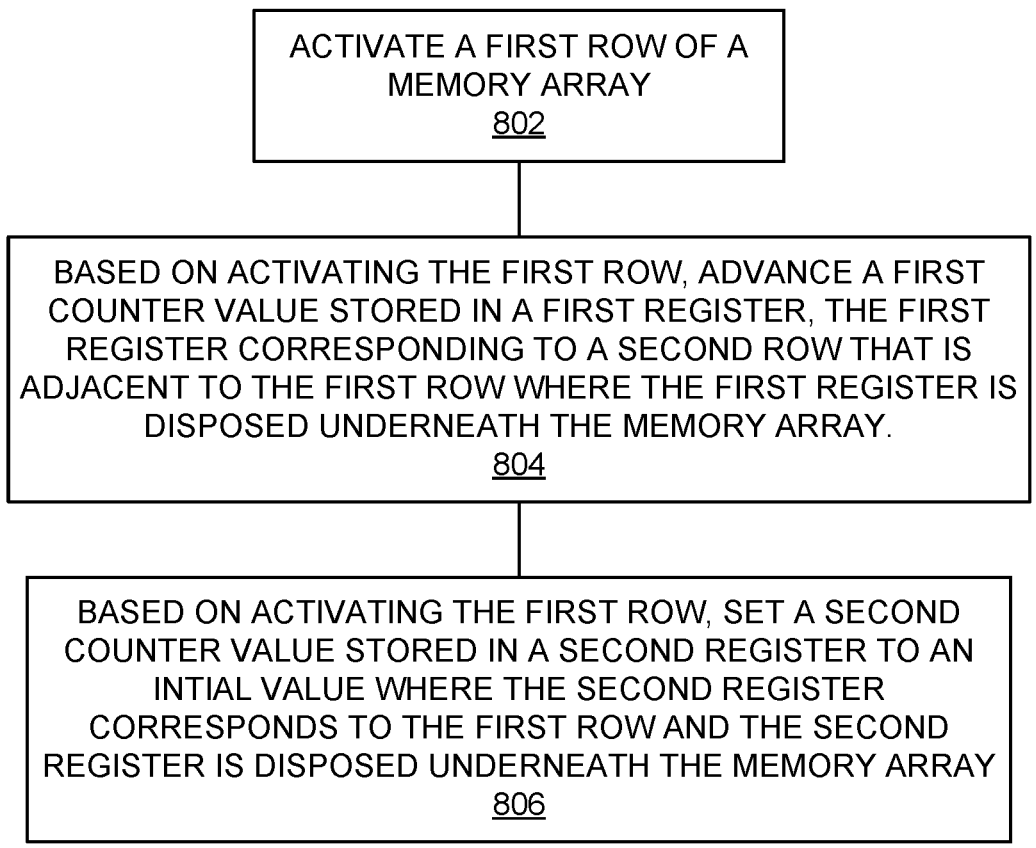
FIG. 8 is a flowchart illustrating an example method of refresh tracking.

FIG. 8 is a flowchart illustrating an example method of refresh tracking. One or more steps illustrated in FIG. 8 may be performed by, for example, MAT 100, integrated circuit 200, counter and control circuitry 300, system 500, and/or their components. A first row of a memory array is activated (802). For example, a first row of MAT 100 may be activated (e.g., by control/decode circuitry 350).

Based on activating the first row, a first counter value stored in a first register is advanced where the first register corresponds to a second row that is adjacent to the first row and the first register is disposed underneath the memory array (804). For example, counters and control circuitry 110 may advance a first counter value in a first counter element that is associated with a second row that is adjacent to the first row and is part of counters and control circuitry 110 which is disposed underneath capacitor arrays 150*a*-150*b*.

Based on activating the first row, a second counter value stored in a second register is set to an initial value where the second register corresponds to the first row and the second register is disposed underneath the memory array (804). For example, counters and control circuitry 110 may set an initial value in a second counter element that is associated with the first row and is part of counters and control circuitry 110 which is disposed underneath capacitor arrays 150*a*-150*b*.

Figure 9:
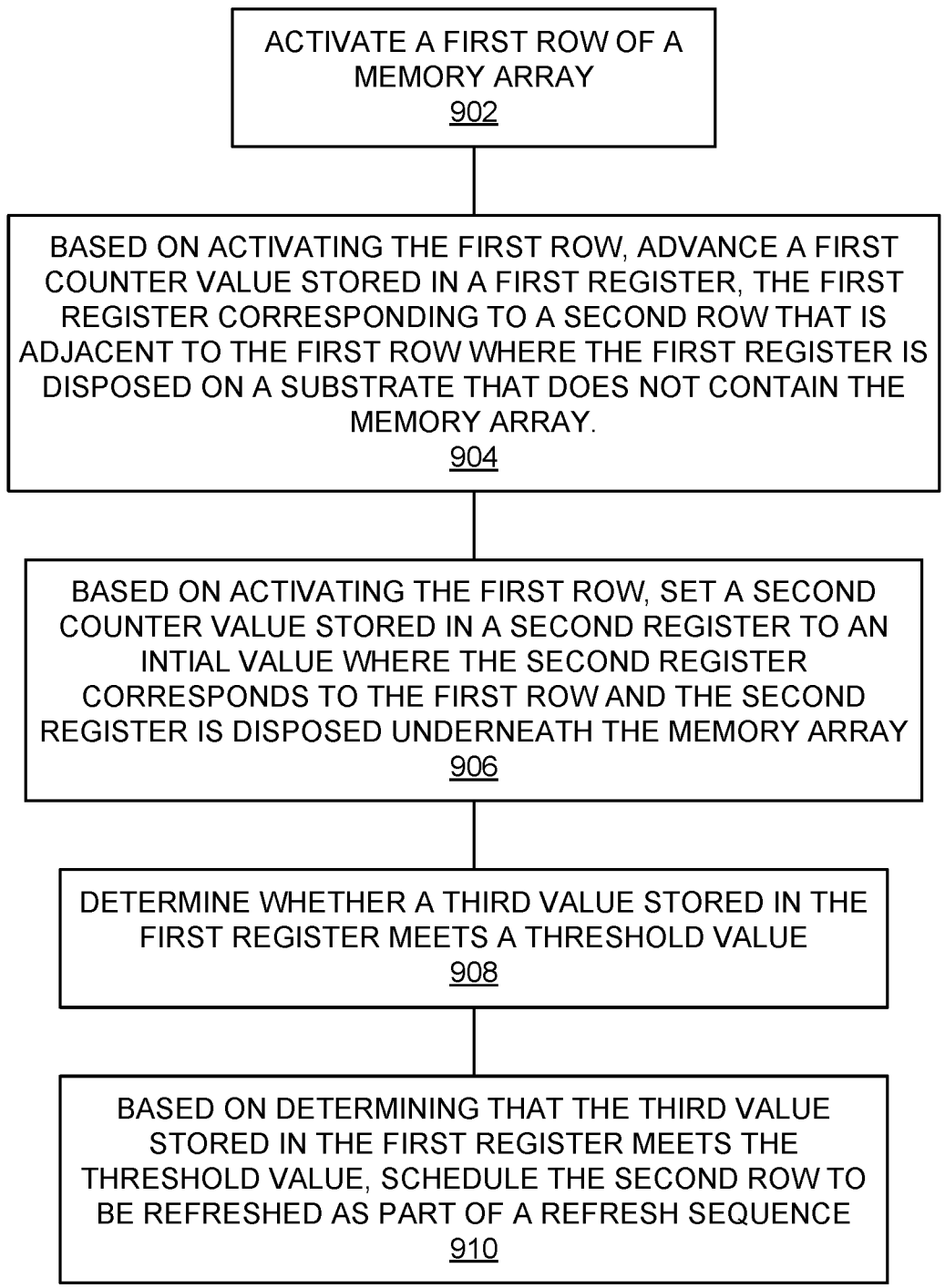
FIG. 9 is a flowchart illustrating an example method of scheduling a refresh for a row being hammered.

FIG. 9 is a flowchart illustrating an example method of scheduling a refresh for a row being hammered. One or more steps illustrated in FIG. 9 may be performed by, for example, MAT 100, integrated circuit 200, counter and control circuitry 300, system 500, and/or their components. A first row of a memory array is activated (902). For example, a first row of MAT 100 may be activated (e.g., by control/decode circuitry 350).

Based on activating the first row, a first counter value stored in a first register is advanced where the first register corresponds to a second row that is adjacent to the first row and the first register is disposed on a substrate that does not contain the memory array (904). For example, counters and control circuitry 110 may advance a counter value in a first counter element that is associated with a second row that is adjacent to the first row and is part of counters and control circuitry 110 which are fabricated on substrate 101.

Based on activating the first row, a second counter value stored in a second register is set to an initial value where the second register corresponds to the first row and the second register is disposed underneath the memory array (906). For example, counters and control circuitry 110 may set an initial value in a second counter element that is associated with the first row and is part of counters and control circuitry 110 which is disposed underneath capacitor arrays 150*a*-150*b*.

It is determined whether a third value stored in the first register meets a threshold value (908). For example, counters and control circuitry 110 may compare the advanced counter value in the first counter element to a row hammer count threshold value. Based on determining that the third value stored in the first register meets the threshold value, the second row is scheduled to be refreshed as part of a refresh sequence (910). For example, based on the advanced counter value in the first counter element to a row hammer count threshold value, the second row may be scheduled (e.g., by system 500) to be refreshed.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of MAT 100, integrated circuit 200, counter and control circuitry 300, system 500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
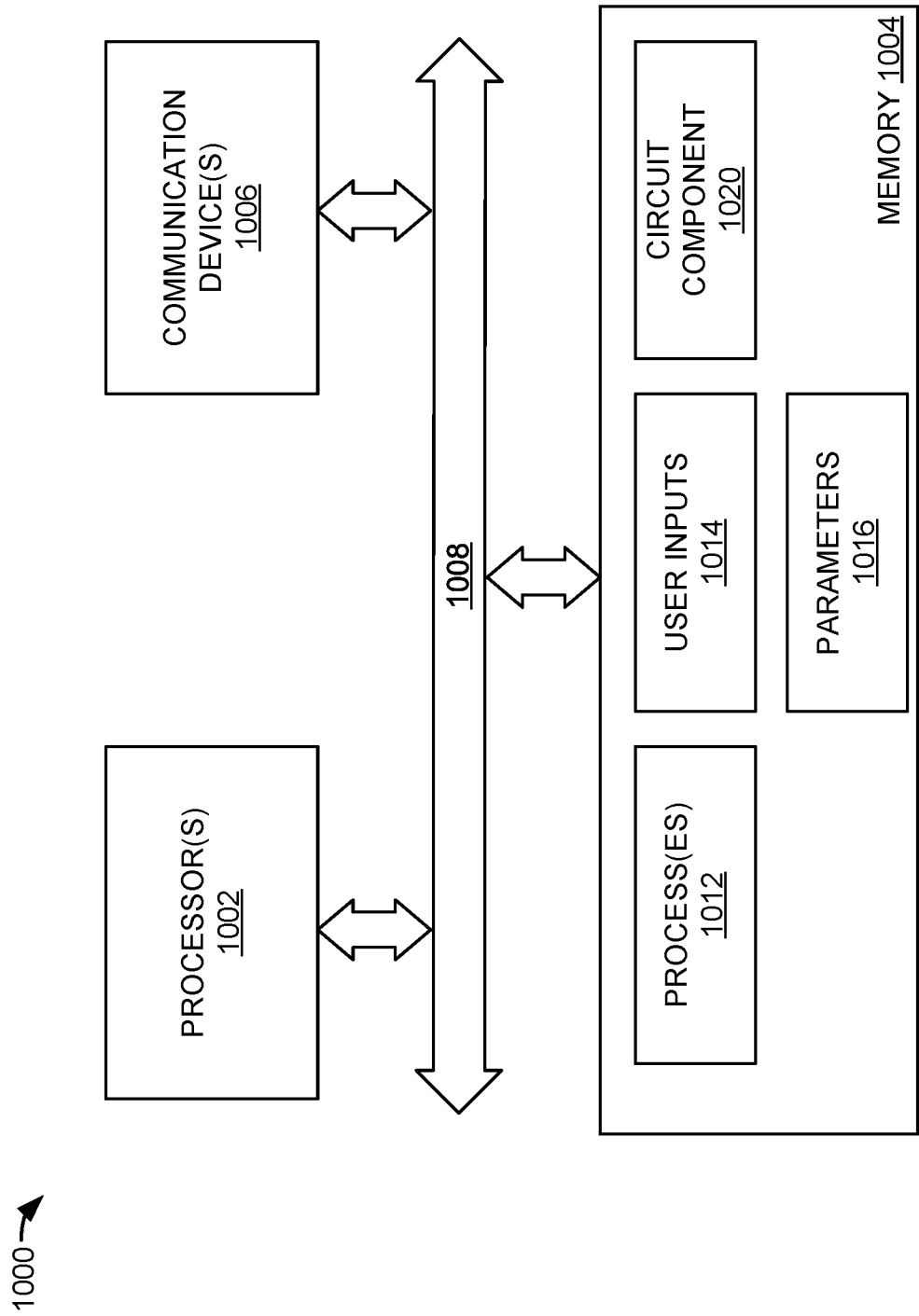
FIG. 10 is a block diagram of a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of MAT 100, integrated circuit 200, counter and control circuitry 300, system 500, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

Implementations discussed herein include, but are not limited to, the following examples:

Example 1: A memory device, comprising: an array of memory cells having a plurality of wordlines; and counter circuitry disposed underneath the array of memory cells, the counter circuitry comprising a plurality of counters each corresponding to a respective one of the plurality of wordlines, where at least one of the plurality of counters is to be updated in response to each row activation.

Example 2: The memory device of example 1, wherein a first value in a first counter corresponding to a first wordline is advanced in response to an activation of a second wordline that is a neighbor of the first wordline.

Example 3: The memory device of example 2, wherein a second value in a second counter corresponding to the second wordline is initialized in response to the activation of the second wordline.

Example 4: The memory device of example 2, wherein based on a third value in the first counter meeting a threshold criteria, a first row corresponding to the first wordline is refreshed.

Example 5: The memory device of example 2, wherein based on a third value in the first counter meeting a threshold criteria, a first row corresponding to the first wordline is scheduled to be refreshed as part of a refresh sequence.

Example 6: The memory device of example 2, wherein based on a third value in the first counter meeting a threshold criteria, a first row corresponding to the first wordline is refreshed without an intervening operation by the memory array after a second row corresponding to the second wordline is closed.

Example 7: The memory device of example 6, wherein based on the first row being refreshed, the memory device indicates to a controller to not use a bank with the first row until the refresh of the first row is complete.

Example 8: A memory device, comprising: an array of memory cells having a plurality of rows; a plurality of sense amplifiers disposed on a substrate; and a plurality of counters each corresponding to respective ones of the plurality of rows, the plurality of counters disposed on the substrate and located beneath the array of memory cells, at least one of the plurality of counters to be updated in response to each row activation.

Example 9: The memory device of example 8, wherein a first value in a first counter corresponding to a first row of the plurality of rows is advanced in response to an activation of a second row that is a neighbor of the first row.

Example 10: The memory device of example 9, wherein a second value in a second counter corresponding to the second row is set to an initial value based on the activation of the second row.

Example 11: The memory device of example 9, wherein, based on a third value in the first counter meeting a threshold value, the first row is refreshed.

Example 12: The memory device of example 9, wherein based on a third value in the first counter meeting a threshold value, the first row is scheduled to be refreshed as part of a refresh sequence.

Example 13: The memory device of example 9, wherein based on a third value in the first counter meeting a threshold value, the first row is refreshed without an intervening operation by the memory array after the second row is closed.

Example 14: The memory device of example 13, wherein based on the first row being refreshed, the memory device indicates to a controller to not use a bank with the first row until the refresh of the first row is complete.

Example 15: A method, comprising: activating a first row of a memory array; based on activating the first row, advance a first counter value stored in a first register, the first register corresponding to a second row that is adjacent to the first row, the first register disposed on a substrate that does not contain the memory array.

Example 16: The method of example 15, wherein the first register is disposed beneath the memory array.

Example 17: The method of example 15, further comprising: based on activating the first row, setting a second counter value stored in a second register to an initial value, the second register corresponding to the first row.

Example 18: The method of example 15, further comprising: determining whether a third value stored in the first register meets a threshold value.

Example 19: The method of example 18, further comprising: based on a determination that the third value meets the threshold value, scheduling the second row to be refreshed as part of a refresh sequence.

Example 20: The method of example 18, further comprising: based on a determination that the third value meets the threshold value, refreshing the second row without an intervening operation by the memory array after the second row is closed; and transmitting an indicator to a controller that the memory array is performing a refresh operation.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory device, comprising:
   an array of memory cells having a plurality of wordlines, the array of memory cells arranged in a first dimensional direction and a second dimensional direction that is orthogonal to the first dimensional direction; and
   counter circuitry disposed underneath the array of memory cells in a third dimensional direction that is orthogonal to the first dimensional direction and the second dimensional direction, the counter circuitry comprising a plurality of counters each corresponding to a respective one of the plurality of wordlines, where at least one of the plurality of counters is to be updated in response to each row activation.

2. The memory device of claim 1, wherein a first value in a first counter corresponding to a first wordline is advanced in response to an activation of a second wordline that is a neighbor of the first wordline.

3. The memory device of claim 2, wherein a second value in a second counter corresponding to the second wordline is initialized in response to the activation of the second wordline.

4. The memory device of claim 2, wherein based on a third value in the first counter meeting a threshold criteria, a first row corresponding to the first wordline is refreshed.

5. The memory device of claim 2, wherein based on a third value in the first counter meeting a threshold criteria, a first row corresponding to the first wordline is scheduled to be refreshed as part of a refresh sequence.

6. The memory device of claim 2, wherein based on a third value in the first counter meeting a threshold criteria, a first row corresponding to the first wordline is refreshed without an intervening operation by the memory array after a second row corresponding to the second wordline is closed.

7. The memory device of claim 6, wherein based on the first row being refreshed, the memory device indicates to a controller to not use a bank with the first row until the refresh of the first row is complete.

8. A memory device, comprising:
   an array of memory cells having a plurality of rows, the array of memory cells arranged in a first dimensional direction and a second dimensional direction that is orthogonal to the first dimensional direction;
   a plurality of sense amplifiers disposed on a substrate; and
   a plurality of counters each corresponding to respective ones of the plurality of rows, the plurality of counters disposed on the substrate and located beneath the array of memory cells in a third dimensional direction that is orthogonal to the first dimensional direction and the second dimensional direction, at least one of the plurality of counters to be updated in response to each row activation.

9. The memory device of claim 8, wherein a first value in a first counter corresponding to a first row of the plurality of rows is advanced in response to an activation of a second row that is a neighbor of the first row.

10. The memory device of claim 9, wherein a second value in a second counter corresponding to the second row is set to an initial value based on the activation of the second row.

11. The memory device of claim 9, wherein, based on a third value in the first counter meeting a threshold value, the first row is refreshed.

12. The memory device of claim 9, wherein based on a third value in the first counter meeting a threshold value, the first row is scheduled to be refreshed as part of a refresh sequence.

13. The memory device of claim 9, wherein based on a third value in the first counter meeting a threshold value, the first row is refreshed without an intervening operation by the memory array after the second row is closed.

14. The memory device of claim 13, wherein based on the first row being refreshed, the memory device indicates to a controller to not use a bank with the first row until the refresh of the first row is complete.

15. A method, comprising:
   activating a first row of a memory array;
   based on activating the first row, advancing a first counter value stored in a first register, the first register corresponding to a second row that is adjacent to the first row, the first register disposed on a substrate that does not contain the memory array.

16. The method of claim 15, wherein the first register is disposed beneath the memory array.

17. The method of claim 15, further comprising:
   based on activating the first row, setting a second counter value stored in a second register to an initial value, the second register corresponding to the first row.

18. The method of claim 15, further comprising:
   determining whether a third value stored in the first register meets a threshold value.

19. The method of claim 18, further comprising:
   based on a determination that the third value meets the threshold value, scheduling the second row to be refreshed as part of a refresh sequence.

20. The method of claim 18, further comprising:
   based on a determination that the third value meets the threshold value, refreshing the second row without an intervening operation by the memory array after the second row is closed; and
   transmitting an indicator to a controller that the memory array is performing a refresh operation.

\* \* \* \* \*